United States Patent
Ueoka et al.

(10) Patent No.: US 11,189,737 B2
(45) Date of Patent: Nov. 30, 2021

(54) LAMINATED BODY

(71) Applicant: IDEMITSU KOSAN CO., LTD., Tokyo (JP)

(72) Inventors: Yoshihiro Ueoka, Chiba (JP); Takashi Sekiya, Chiba (JP); Shigekazu Tomai, Chiba (JP); Emi Kawashima, Chiba (JP); Yuki Tsuruma, Chiba (JP); Motohiro Takeshima, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 521 days.

(21) Appl. No.: 16/065,239

(22) PCT Filed: Dec. 26, 2016

(86) PCT No.: PCT/JP2016/088765
§ 371 (c)(1),
(2) Date: Jun. 22, 2018

(87) PCT Pub. No.: WO2017/111174
PCT Pub. Date: Jun. 29, 2017

(65) Prior Publication Data
US 2020/0266304 A1    Aug. 20, 2020

(30) Foreign Application Priority Data

Dec. 25, 2015 (JP) .............................. JP2015-254555
Aug. 15, 2016 (JP) .............................. JP2016-159352

(51) Int. Cl.
*H01L 29/872* (2006.01)
*H01L 29/04* (2006.01)
(Continued)

(52) U.S. Cl.
CPC ............ *H01L 29/872* (2013.01); *H01L 29/04* (2013.01); *H01L 29/78693* (2013.01); *H01L 29/247* (2013.01); *H01L 29/26* (2013.01)

(58) Field of Classification Search
None
See application file for complete search history.

(56) References Cited

U.S. PATENT DOCUMENTS 4,062,103 A * 12/1977 Yamagishi ........ H01L 21/28581
438/571
9,105,609 B2  8/2015 Yamazaki
(Continued)

FOREIGN PATENT DOCUMENTS

| CN | 104979407 A | 10/2015 |
| CN | 105097896 A | 11/2015 |

(Continued)

OTHER PUBLICATIONS

International Search Report PCT/JP2016/088765 dated Mar. 7, 2017.

(Continued)

*Primary Examiner* — Evren Seven
(74) *Attorney, Agent, or Firm* — Millen White Zelano & Branigan, PC; Brion P. Heaney

(57) ABSTRACT

A laminated body comprising a substrate, one or more layers selected from a contact resistance reducing layer and a reduction suppressing layer, a Schottky electrode layer and a metal oxide semiconductor layer in this order.

22 Claims, 5 Drawing Sheets

(51) Int. Cl.
  *H01L 29/786* (2006.01)
  *H01L 29/24* (2006.01)
  *H01L 29/26* (2006.01)

(56) References Cited

U.S. PATENT DOCUMENTS

| | | | |
|---|---|---|---|
| 9,171,967 B2 | 10/2015 | Takizawa | |
| 9,412,882 B2 | 8/2016 | Takizawa | |
| 9,461,135 B2* | 10/2016 | Kanamura | H03F 1/3241 |
| 9,595,586 B2 | 3/2017 | Takizawa | |
| 10,340,356 B2* | 7/2019 | Kawashima | H01L 29/247 |
| 10,546,960 B2* | 1/2020 | Yamazaki | H01L 21/02164 |
| 10,804,362 B2* | 10/2020 | Tokuda | H01L 29/24 |
| 10,818,815 B2* | 10/2020 | Shibata | H01L 31/1856 |
| 2001/0034116 A1* | 10/2001 | Lee | H01L 29/872 |
| | | | 438/604 |
| 2015/0325660 A1* | 11/2015 | Hitora | H01L 21/0257 |
| | | | 257/43 |
| 2016/0211386 A1 | 7/2016 | Tomai | |
| 2016/0365421 A1 | 12/2016 | Hasegawa et al. | |
| 2017/0263786 A1 | 9/2017 | Tomai | |
| 2018/0240901 A1* | 8/2018 | Tu | H01L 21/02381 |

FOREIGN PATENT DOCUMENTS

| | | |
|---|---|---|
| JP | 2013102081 A | 5/2013 |
| JP | 2015084439 A | 4/2015 |
| JP | 2015109315 A | 6/2015 |
| JP | 2015227279 A | 12/2015 |
| WO | 2015025499 A1 | 2/2015 |
| WO | 2015025500 A1 | 2/2015 |

OTHER PUBLICATIONS

English translation of Written Opinion in PCT/JP2016/088765 dated Jul. 5, 2018.
Chasin et al: IEEE Transactions on Electronic Devices Oct. 2013, vol. 60. No. 10 (ISSN 0018-9383) pp. 3407-3412.
Office Action in corresponding Chinese Appln. No. CN201680075286.7 dated Dec. 3, 2020 (pp. 1-6).

* cited by examiner

LAMINATED BODY

TECHNICAL FIELD

The invention relates to a laminated body, a semiconductor device using the same, and an electronic circuit and an electric apparatus using the same.

BACKGROUND ART

A Schottky barrier diode is a diode having a rectifying function utilizing a potential barrier formed on the junction surface of a Schottky metal having a sufficiently high carrier concentration and a semiconductor. For example, when the work function of the metal is taken as φm and the work function of the n type semiconductor is taken as φs (where the work function of the semiconductor is defined as the difference between the vacuum level and the Fermi level), if a metal and a semiconductor that satisfy relationship |φm|>|φs| are brought into contact with each other, electrons present near the contact interface of the semiconductor move towards the metal so that the Fermi level of the metal coincides with the Fermi level of the semiconductor, and a depletion region is formed at the contact interface of the semiconductor, and at the same time, a potential barrier is formed at the metal-semiconductor interface. In this case, it is a diode with a metal side as a positive electrode and a semiconductor side as a negative electrode. At the time of application of forward bias, the potential barrier lowers, and electrons flow across the barrier, whereby current flows. At the time of application of reverse bias, electrons are blocked by the potential barrier and current flow is blocked. As the semiconductor, Si is most commonly used.

A Si-based Schottky diode is used in a high-speed switching device, a transmission/receiving mixer in a several GHz frequency band, a frequency conversion device or the like. It is generally used for power semiconductors. Since it has a small band gap of 1.1 eV and a small dielectric breakdown field of 0.3 MV/cm, it is required to increase the thickness of the device in order to allow it to have a large withstand voltage, leading to an increase in forward on-resistance. In addition, a Si-based Schottky barrier diode having a high-speed response has an insufficient withstand voltage.

A Schottky diode utilizing SiC is also known. SiC has a large band gap of 3 eV or more and has a large dielectric breakdown field of 3 MV/cm or more. Therefore, a SiC-based Schottky diode is suited to power semiconductors, and active studies have been made on application of a SiC-based Schottky diode to power semiconductors. However, since it is difficult to fabricate a good crystal substrate, and epitaxial growth requires high-temperature processes, use of SiC has problems in respect of mass productivity and cost.

β-$Ga_2O_3$ has a further wider band gap (4.8 eV to 4.9 eV), and hence, is expected to have a high withstand voltage. However, it has a problem in producing a good substrate as well as in mass productivity and cost.

An oxide semiconductor has a wide band gap as compared with Si and has a high dielectric breakdown field, and therefore, it is expected to be applied to a power semiconductor. In particular, a Schottky barrier diode is expected to have a high-speed response and excellent reverse recovery characteristics.

Non-Patent Document 1 discloses a Schottky barrier diode in which amorphous IGZO is used as an oxide semiconductor and a Ti/Pd laminated body is used as a Schottky metal electrode. In this technology, by subjecting Pd to an oxygen plasma treatment, an excellent Schottky barrier is formed. However, in this technology, leakage current in a reverse direction is large, and when this is incorporated into an electronic circuit in which a Schottky barrier diode is used, there is a concern that power loss at the time of output becomes large as compared with the input power or a circuit itself malfunctions. Further, in this technology, only a diode in which current is taken out in a lateral direction is formed, and it is difficult to extract large current due to the resistance of the extraction electrode.

Patent Document 1 discloses a Schottky barrier diode in which a $Ga_2O_3$ or the like are used as an oxide semiconductor layer and the oxide semiconductor layer is disposed between an ohmic electrode layer and a Schottky electrode layer. However, if a $Ga_2O_3$-based semiconductor layer is formed on a silicon substrate, for example, a forward on-resistance is increased, and when this is incorporated into an electric circuit in which a Schottky barrier diode is used, power loss at the time of output becomes large as compared with the input power.

Patent Document 2 discloses a technology in which a gate electrode and a source or drain electrode of FET using an oxide semiconductor are electrically connected, realizing a diode having a small reverse saturated current. However, by this method, the device structure becomes complicated, resulting in poor yield when fabricated into a device.

RELATED ART DOCUMENTS

Patent Documents

Patent Document 1: JP-A-2013-102081
Patent Document 2: JP-A-2015-84439

Non-Patent Document

Non-Patent Document 1: IEEE TRANSACTION ON ELECTRON DEVICES, Vol. 60, No. 10, OCTOBER 2013, p. 3407

SUMMARY OF THE INVENTION

An object of the invention is to provide a semiconductor device that has a small forward on-resistance, a small reverse leakage current, and that enables current to be extracted with only a small power loss, as well as a laminated body used in such a semiconductor device.

According to the invention, the following laminated body or the like are provided.
1. A laminated body comprising a substrate, one or more layers selected from a contact resistance reducing layer and a reduction suppressing layer, a Schottky electrode layer and a metal oxide semiconductor layer in this order.
2. The laminated body according to 1, comprising the substrate, the contact resistance reducing layer and the reduction suppressing layer in this order.
3. The laminated body according to 1 or 2, wherein the reduction suppressing layer comprises one or more elements selected from Pd, Mo, Pt, Ir, Ru, Au, Ni, W, Cr, Re, Te, Tc, Mn, Os, Fe, Rh and Co.
4. The laminated body according to any one of 1 to 3, wherein the contact resistance reducing layer comprises one or more metals selected from Ti, Mo, Ag, In, Al, W, Co and Ni, or silicides thereof.
5. The laminated body according to any one of 1 to 4, wherein the Schottky electrode layer comprises an oxide of one or more elements having a work function of 4.4 eV or more.

6. The laminated body according to any one of 1 to 5, wherein the Schottky electrode layer comprises an oxide of one or more metals selected from Pd, Mo, Pt, Ir, Ru, Ni, W, Cr, Re, Te, Tc, Mn, Os, Fe, Rh and Co.

7. The laminated body according to any one of 1 to 6, wherein the substrate is a conductive substrate.

8. The laminated body according to any one of 1 to 6, wherein the substrate is a conductive silicon substrate.

9. The laminated body according to any one of 1 to 8, wherein the metal oxide semiconductor layer comprises one or more elements selected from In, Sn, Ga and Zn.

10. The laminated body according to any one of 1 to 9, wherein the metal oxide semiconductor layer has a hydrogen atom concentration of $10^{17}$ to $10^{22}/cm^3$.

11. The laminated body according to any one of 1 to 10, which comprises an ohmic electrode layer on the metal oxide semiconductor layer.

12. The laminated body according to any one of 1 to 11, wherein an outer edge of the metal oxide semiconductor layer is positioned on the same position as the position of an outer edge of the Schottky electrode layer or is positioned on the inside of an outer edge of the Schottky electrode layer, and the Schottky electrode layer is in contact with an entire lower surface of the metal oxide semiconductor layer.

13. The laminated body according to 11 or 12, wherein the outer edge of the ohmic electrode layer is positioned on the same position as the position of the outer edge of the metal oxide semiconductor layer or is positioned on the inside of the outer edge of the metal oxide semiconductor layer.

14. A semiconductor device wherein the laminated body according to any one of 1 to 13 is used.

15. A Schottky barrier diode wherein the semiconductor device according to 14 is used.

16. A junction transistor wherein the semiconductor according to 14 is used.

17. An electronic circuit wherein the semiconductor device according to claim 14, the Schottky barrier diode according to 15 or the junction transistor according to 16 is used.

18. An electric apparatus, an electronic apparatus, a vehicle or power engine wherein the electronic circuit according to 17 is used.

According to the invention, it is possible to provide a semiconductor device that has a small forward on-resistance, a small reverse leakage current, and enables current to be extracted with a small power loss, and a laminated body used therein.

MODE FOR CARRYING OUT THE INVENTION

[Laminated Body]

Figure 1:
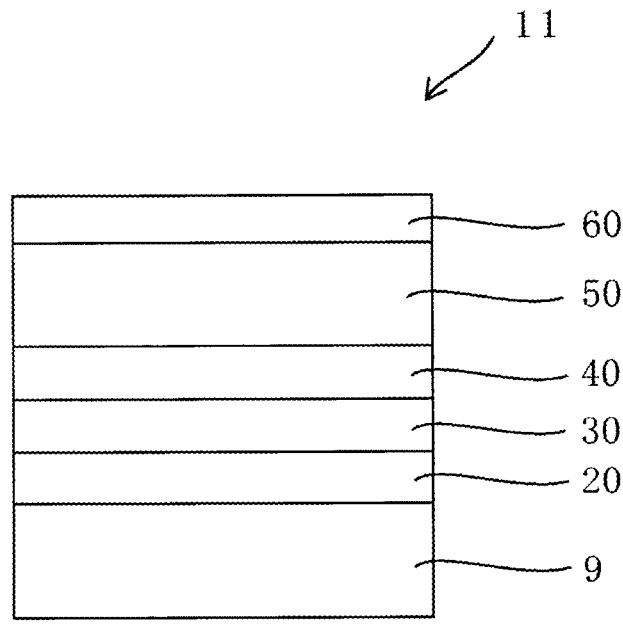
FIG. 1 is a cross-sectional view schematically showing one embodiment of the laminated body of the invention.

One aspect of the laminated body of the invention comprises a substrate, one or more layers selected from a contact resistance reducing layer and a reduction suppressing layer, a Schottky barrier electrode layer and a metal oxide semiconductor layer in this order.

In one aspect of the laminated body of the invention, a Schottky barrier diode can be formed on any substrate or any base material.

There may be any layer disposed between the substrate and one or more layers selected from the contact resistance reducing layer and the reduction suppressing layer.

It is preferred that the one or more layers selected from the contact resistance reducing layer and the reduction suppressing layer be in contact with the Schottky electrode layer, and it is preferred that the Schottky electrode layer and the metal oxide layer be in contact with each other.

In another aspect of the laminated body of the invention, on a conductive substrate, at least the Schottky electrode layer and the metal oxide semiconductor layer are provided in this order, and between the conductive substrate and the Schottky electrode layer, one or more layers selected from the contact resistance reducing layer and the reduction suppressing layer are provided.

The laminated body according to one aspect of the invention and the laminated body according to another aspect of the invention are comprehensively referred to as the "laminated body of the invention".

The laminated body of the invention may comprise both the contact resistance reducing layer and the reduction suppressing layer, or may comprises any one of these. It is preferred that the laminated body of the invention comprise both the contact resistance reducing layer and the reduction suppressing layer, or only the contact resistance reducing layer.

In the laminated body of the invention, an ohmic electrode layer may be laminated on the metal oxide semiconductor layer, that is, on the side opposite to the Schottky electrode layer side.

Due to the above-mentioned configuration, the laminated body of the invention can have a small forward on-resistance when used in a semiconductor device. Further, reverse leakage current can be reduced, whereby current can be extracted with reduced power loss.

As the layer configuration of the laminated body of the invention, the following configurations can be given.

(1) Substrate//contact resistance reducing layer/Schottky electrode layer/metal oxide semiconductor layer (2) Substrate//reduction suppressing layer/Schottky electrode layer/metal oxide semiconductor layer (3) Substrate//contact resistance reducing layer/reduction suppressing layer/Schottky electrode layer/metal oxide semiconductor layer ("/" means that the layers are stacked such that they are adjacent to each other)

("//" means that the layers are stacked without being adjacent to each other)

As the layer configuration in which an ohmic electrode layer is laminated on the laminated body of the invention, the following configurations can be given.

(4) Substrate//contact resistance reducing layer/Schottky electrode layer/metal oxide semiconductor layer/ohmic electrode layer (5) Substrate//reduction suppressing layer/Schottky electrode layer/metal oxide semiconductor layer/ohmic electrode layer (6) Substrate//contact resistance reducing layer/reduction suppressing layer/Schottky electrode layer/metal oxide semiconductor layer/ohmic electrode layer The laminated layer structure in (6) mentioned above is shown in FIG. 1. In a laminated body 1, on a substrate 9, a contact resistance reducing layer 20, a reduction suppressing layer 30, a Schottky electrode layer 40, a metal oxide semiconductor layer 50 and an ohmic electrode layer 60 are laminated in this order.

An outer edge (edge part) of the metal oxide semiconductor layer 50 may be positioned on the same position as the position of an outer edge of the Schottky electrode layer 40 or may be positioned on the inside of an outer edge of the Schottky electrode layer 40. The latter case is shown as a laminated body 2 in FIG. 2.

In each drawing of the invention, the same numerals mean the same configurations.

An outer edge (edge part) of the ohmic electrode layer 60 may be positioned on the same position as the position of the metal oxide semiconductor layer 50 or may be positioned on the inside of the outer edge of the metal oxide semiconductor layer 50. The latter case is shown as a laminated body 3 in FIG. 3.

Each configuration will be mentioned later.

The following configurations can also be given as the layer configuration of the laminated body of the invention.

(11) Conductive substrate/contact resistance reducing layer/Schottky electrode layer/metal oxide semiconductor layer

(12) Conductive substrate/reduction suppressing layer/Schottky electrode layer/metal oxide semiconductor layer

(13) Conductive substrate/contact resistance reducing layer/reduction suppressing layer/Schottky electrode layer/metal oxide semiconductor layer ("/" means that the layers are laminated such that they are adjacent to each other)

As the layer configuration in which the ohmic electrode layer is laminated on the laminated body of the invention, the following configuration can also be given.

(14) Conductive substrate/contact resistance reducing layer/Schottky electrode layer/metal oxide semiconductor layer/ohmic electrode layer

(15) Conductive substrate/reduction suppressing layer/Schottky electrode layer/metal oxide semiconductor layer/ohmic electrode layer

Figure 4:
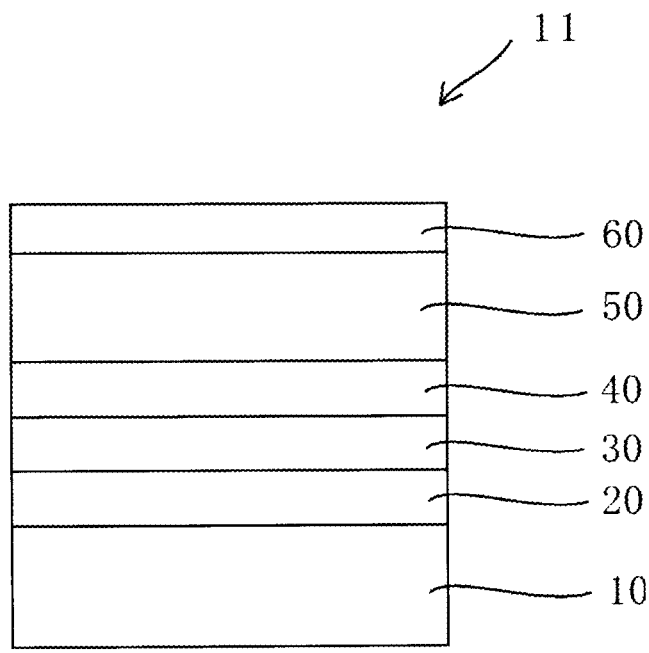
FIG. 4 is a cross-sectional view schematically showing another embodiment of the invention.

(16) Conductive substrate/contact resistance reducing layer/reduction suppressing layer/Schottky electrode layer/metal oxide semiconductor layer/ohmic electrode layer The laminated layer structure in (16) is shown in FIG. 4. In the laminated body 11, on a conductive substrate 10, a contact resistance reducing layer 20, a reduction suppressing layer 30, a Schottky electrode layer 40, a metal oxide semiconductor layer 50 and an ohmic electrode layer 60 are stacked in this order.

An outer edge (edge part) of the metal oxide semiconductor layer 50 may be positioned on the same position as the position of the outer edge (edge part) of the Schottky electrode layer 40 or may be positioned on the inside of the outer edge of the Schottky electrode layer 40. The latter case is shown as a laminated body 12 in FIG. 5. In this case, a configuration in which the Schottky electrode layer 40 covers the lower surface of the metal oxide semiconductor layer 50, i.e. the entire lower surface of the metal oxide semiconductor layer 50 is in contact with the Schottky electrode layer 40, is realized.

In a covalent crystalline semiconductor such as Si, in order to realize a high withstand voltage, it is necessary to realize a structure in which an end part of the semiconductor is not directly in contact with the Schottky electrode. On the other hand, in a metal oxide semiconductor, leakage current at the end of the film is small, and hence, a configuration in which the end part of the metal oxide semiconductor layer is positioned on the same position or on the inside of the Schottky metal electrode is realized. Due to such a configuration, when reverse bias is applied, concentration of electric field at the end part of the semiconductor layer can be prevented, whereby a high dielectric voltage can be realized.

The outer edge (edge part) of the ohmic electrode layer 60 may be positioned on the same position as the position of the outer edge (edge part) of the metal oxide semiconductor layer 50 or may be positioned on the inside of the outer edge (edge part) of the metal oxide semiconductor layer 50. The latter case is shown as a laminated body 13 in FIG. 6. In this case, a configuration in which the metal oxide semiconductor layer 50 covers the lower surface of the ohmic electrode layer 60 is realized.

Figure 2:
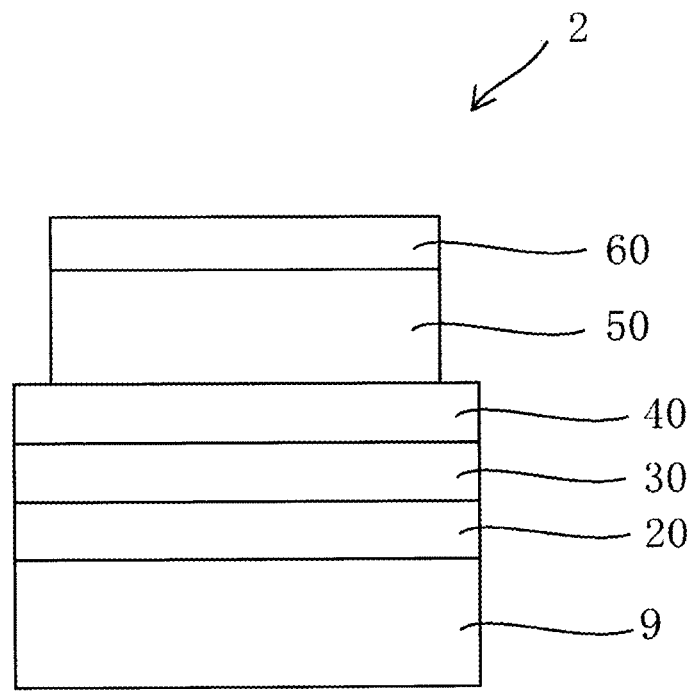
FIG. 2 is a cross-sectional view schematically showing another embodiment of the laminated body of the invention.
Figure 3:
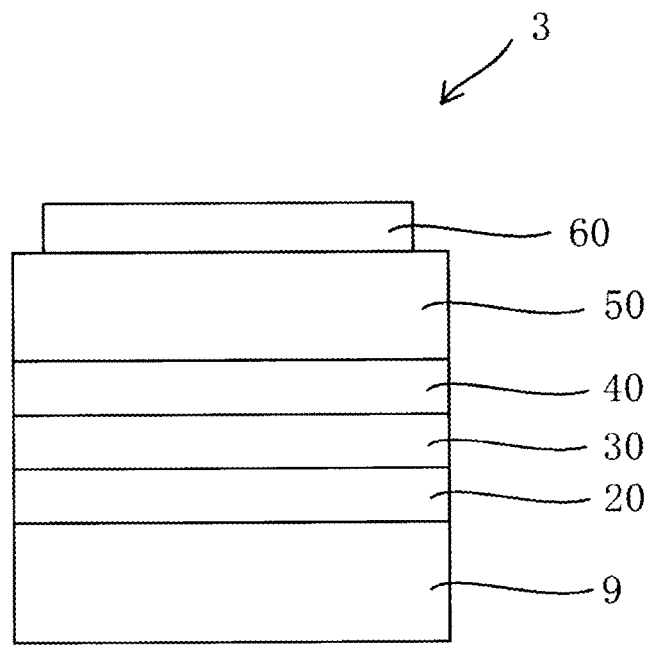
FIG. 3 is a cross-sectional view schematically showing another embodiment of the invention.

The configurations in FIGS. 2 and 3 can be applied to the laminated layer structure other than the laminated layer structure in Formula (6). In addition, the configurations shown in FIGS. 2 and 3 can be provided simultaneously.

Figure 5:
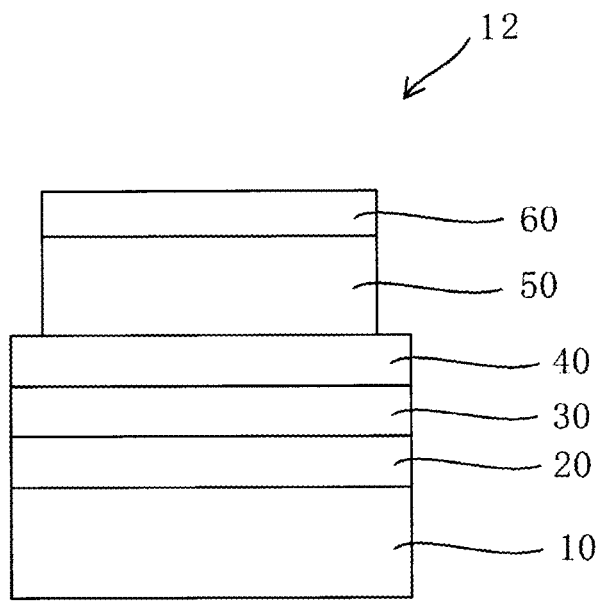
FIG. 5 is a cross-sectional view schematically showing another embodiment of the invention.
Figure 6:
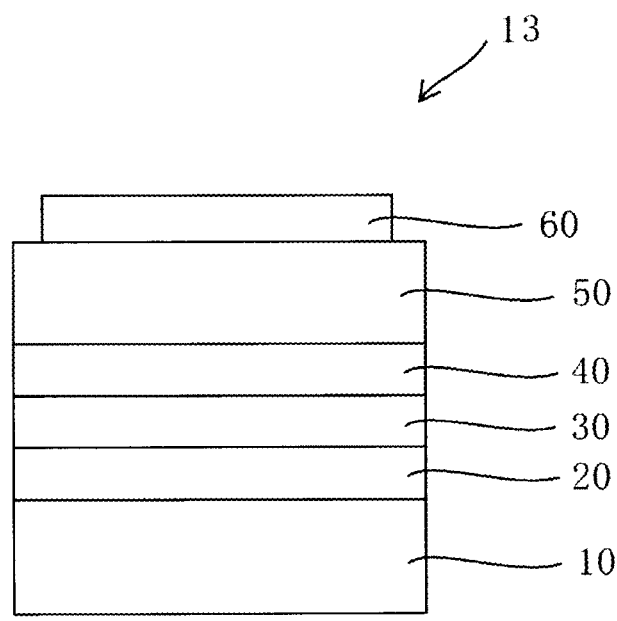
FIG. 6 is a cross-sectional view schematically showing another embodiment of the invention.

The configurations in FIGS. 5 and 6 can be applied to the laminated layer structure other than the laminated layer structure in Formula (16). In addition, the configurations shown in FIGS. 5 and 6 can be provided simultaneously.

Figure 7:
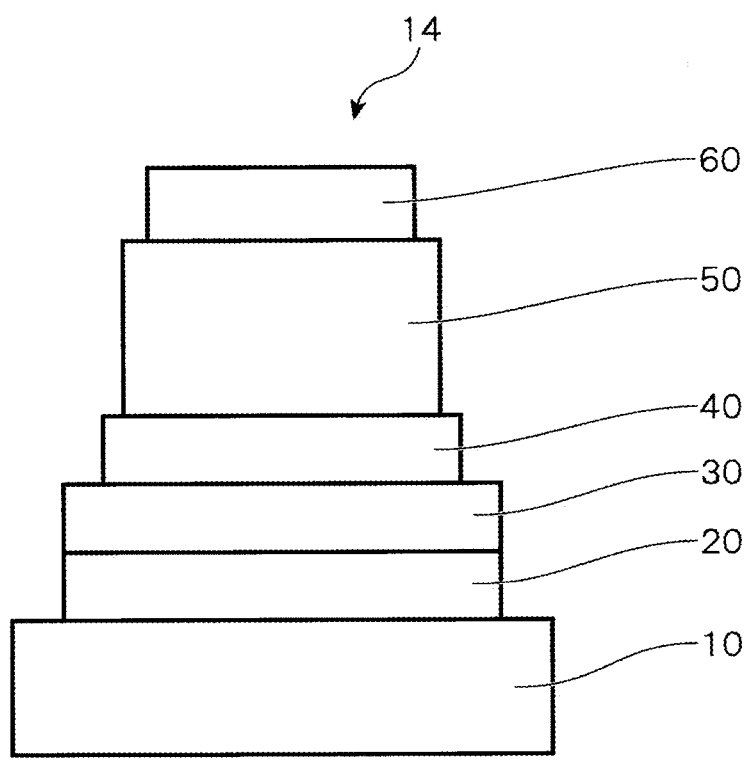
FIG. 7 is a cross-sectional view schematically showing another embodiment of the invention.

Another embodiment of the laminated layer structure shown in (16) above is shown in FIG. 7. A laminated body 14 in FIG. 7 is a laminated layer structure in which the configurations shown in FIGS. 5 and 6 are simultaneously provided. Further, it has a configuration in which the outer edge (edge part) of the Schottky metal electrode layer 40 is positioned on the inside of the outer edge (edge part) of the reduction repressing layer 30, and the outer edge (edge part) of the contact resistance reducing layer 20 is positioned on the inside of the outer edge (edge part) of the conductive substrate 10.

Hereinbelow, an explanation is made on each layer constituting the laminated body of the invention.

(Substrate)

No particular restrictions are made as a substrate, and known substrates can be used. A conductive substrate, a semiconductor substrate, an insulating substrate or the like can be given.

As the conductive substrate, a silicon substrate or a metal substrate can be given. A preferable substrate is a low-resistance silicon substrate having a high concentration of doped impurities. More preferably, a n-type low-resistance silicon substrate. As the dopant, conventionally known B, P, Pb, As or the like can be used.

It is preferred that a silicon substrate have a low resistance. The volume resistivity p of the silicon substrate is preferably 100 mΩcm or less, more preferably 10 mΩcm or less, with 5 mΩcm or less being further preferable.

As the metal of the metal substrate, Cu, Al, Au, Cr, Fe, Ni, W or the like can be given, and an alloy thereof can also be used. Cu, Al or an alloy thereof which has a low resistance, is available at a low cost and has excellent heat conductance is preferable.

When a metal substrate is used as a conductive substrate, this metal substrate can be used as the contact resistance reducing layer.

The laminated body of the invention can provide a Schottky barrier diode that exhibits preferable diode properties even when a cheap silicon substrate or a metal substrate is used as a conductive substrate.

The thickness of the conductive substrate is normally 200 μm to 2 mm.

No particular restrictions are imposed on materials for the semiconductor substrate as long as the surface smoothness is kept.

As the semiconductor substrate, a Si substrate, a GaN substrate, a SiC substrate, a GaP substrate, a GaAs substrate, a ZnO substrate, a $Ga_2O_3$ substrate, a GaSb substrate, an InP substrate, an InAs substrate, an InSb substrate, a ZnS substrate, a ZnTe substrate, a diamond substrate or the like, of which the carrier concentration is adjusted to be $1 \times 10^{18}$ $cm^{-3}$ or less can be given.

A semiconductor substrate may be monocrystalline or polycrystalline. It may be an amorphous substrate or a partially amorphous substrate. A substrate on which a semiconductor film is formed using a technique such as CVD (Chemical Vapor Deposition) or the like may be used on a conductor substrate, a semiconductor substrate, and an insulating substrate may be used.

The thickness of the semiconductor substrate is normally 200 μm to 2 mm. The thickness of the semiconductor substrate is preferably 200 μm to 1 mm, and more preferably 200 μm to 700 μm. By allowing the thickness to be 200 μm to 1 mm, processability at the time of dicing after fabrication of a device is improved, the yield of the device is enhanced, whereby productivity tends to be improved.

No specific restrictions are imposed on the insulating substrate as long as it is a substrate having insulating properties. Within a range that the advantageous effects of the invention are not impaired, a commonly used substrate can be arbitrary selected.

As the insulating substrate, for example, an alkali-free glass substrate produced by a fusion method or a floating method such as quartz glass, barium borosilicate glass, aluminoborosilicate glass, aluminosilicate glass or the like, which are manufactured by a fusion method or a float method, a ceramic substrate and a plastic substrate that has a heat resistance that can withstand the processing temperature of this fabrication process.

Further, as the insulating substrate, a dielectric substrate may also be used.

As the insulating substrate, a lithium niobate substrate, a lithium tantalate substrate, a zinc oxide substrate, a quartz substrate, a sapphire substrate or the like can be given.

Further, an insulating substrate and a dielectric substrate in which an insulating film or a dielectric film is provided on the surface of a metal substrate such as stainless steel may be used.

Further, an insulating film may be formed as an undercoat film on the substrate. As the undercoat film, a single layer or a stacked layer of a silicon oxide film, a silicon nitride film, a silicon oxynitride film, a silicon nitrided oxide film or the like can be formed.

The thickness of the insulating substrate not particularly restricted but is, for example, 2 μm to 2 mm. The thickness of the semiconductor substrate is preferably 2 μm to 1 mm, and more preferably 2 μm to 700 μm. By allowing the thickness to be 2 μm to 1 mm, processability at the time of dicing after fabrication of a device is improved, the yield of the device is enhanced, whereby productivity tends to be improved.

On the conductive substrate, the semiconductor substrate or the insulating substrate, a base material having an arbitrary structure composed of a plurality of materials, a layer structure, a circuit, a wiring, an electrode or the like may be used.

As the material of the arbitrary structure, various composite materials of metals and insulating products such as a metal and an interlayer insulating film forming a back end of line of a large-scale integrated circuit (LSI) or the like can be given.

The surface roughness of the substrate is not particularly restricted, but is preferably 150 nm or less, more preferably 50 nm or less, and further preferably 10 nm or less. A substrate having a small surface roughness and having a high degree of surface smoothness enables the smoothness of the Schottky electrode layer to be kept when the contact resistance reducing layer, the reduction suppressing layer and the Schottky electrode layer are stacked, whereby the reverse leakage current when evaluated as a device can be suppressed.

The surface roughness of the substrate can be obtained by the method stated in the Examples.

The layers of the layer structure are not particularly restricted, and known layers such as an electrode layer, an insulating layer, a semiconductor layer, a dielectric layer, a protective film layer, a stress buffer layer, a light shielding layer, an electron/hole-injecting layer, an electron/hole-transporting layer, a light emitting layer, an electron/hole-blocking layer, a crystal growth layer, an adhesion-improving layer, a memory layer, a liquid crystal layer, a capacitor layer, a power storage layer or the like can be used.

As the electrode layer, in general, an Al layer, a Si layer, a Sc layer, a Ti layer, a V layer, a Cr layer, a Ni layer, a Cu layer, a Zn layer, a Ga layer, a Ge layer, a Y layer, a Zr layer, a Nb layer, a Mo layer, a Tc layer, a Ru layer, a Rh layer, a Pd layer, an Ag layer, a Cd layer, an In layer, a Sn layer, a Sb layer, a Te layer, a Hf layer, a Ta layer, a W layer, a Re layer, an Os layer, an Ir layer, a Pt layer, an Au layer, an alloy layer containing one or more of the metals in these layers, an oxide electrode layer or the like can be given. It is possible to increase the carrier density of the semiconductor such as an oxide semiconductor or Si, and to use the semiconductor in the electrode layer.

As the insulating layer, in general, an oxide insulating film, a nitride film or the like, containing one or more metals selected from the group consisting of Al, Si, Sc, Ti, V, Cr, Ni, Cu, Zn, Ga, Ge, Y, Zr, Nb, Mo, Tc, Ru, Rh, Pd, Ag, Cd, In, Sn, Sb, Te, Hf, Ta, W, Re, Os, Ir, Pt and Au can be given.

As the semiconductor layer, a wide variety of layers can be given irrespective of the crystal state, i.e., being monocrystalline, polycrystalline or amorphous. Examples thereof include an oxide semiconductor layer such as a Si layer, a GaN layer, a SiC layer, a GaP layer, a GaAs layer, a GaSb layer, an InP layer, an InAs layer, an InSb layer, a ZnS layer, a ZnTe layer, a diamond layer, an oxide semiconductor layer such as $Ga_2O_3$, ZnO and InGaZnO, an organic semiconductor layer such as pentacene.

As the dielectric layer, a lithium niobate layer, a lithium tantalate layer, a zinc oxide layer, a quartz substrate layer, a sapphire layer, a $BaTiO_3$ layer, a $Pb(Zr,Ti)O_3$(PZT) layer, a $(Pb,La)(Zr,Ti)O_3$ (PLZT) layer, a $Pb(Zr,Ti,Nb)O_3$ (PZTN) layer, a $Pb(Ni,Nb)O_3$—$PbTiO_3$(PNN-PT) layer, a $Pb(Ni,Nb)O_3$—$PbZnO_3$ (PNN-PT) layer, a $Pb(Mg,Nb)O_3$—$PbTiO_3$ (PMN-PT) layer, a $SrBi_2Ta_2O_9$ (SBT layer), a $(K,Na)TaO_3$ layer, a (K,Na)NbO$_3$ layer, a BiFeO$_3$ layer, a Bi(Nd, La)TiO$_x$ layer (x=2.5 to 3.0), a HfSiO(N) layer, a HfO$_2$—Al$_2$O$_3$ layer, a La$_2$O$_3$ layer, a La$_2$O$_3$—Al$_2$O$_3$ layer or the like can be given.

As the film of the protective film layer, a film improved in insulating properties irrespective of being inorganic or organic, and has low transmission of water or the like. As the protective film layer, a SiO$_2$ layer, a SiNx layer (x=1.20 to 1.33), a SiON layer, an Al$_2$O$_3$ layer or the like can be given.

As the stress buffer layer, an AlGaN layer or the like can be given.

As the light-shielding layer, for example, a black matrix layer containing a metal, a metal-organic material or the like, and a color filter layer can be mentioned.

Examples of the electron/hole-injecting layer include an oxide semiconductor layer, an organic semiconductor layer or the like.

Examples of the electron/hole-transporting layer include an oxide semiconductor layer, an organic semiconductor layer or the like.

As the emitting layer, an inorganic semiconductor layer, an organic semiconductor layer or the like can be given.

As the electron/hole-blocking layer, an oxide semiconductor layer or the like can be given.

Examples of the base material include a power generation device, a light-emitting device, a sensor, a power conversion device, a calculation device, a protection device, an optoelectronic device, a display, a memory, a semiconductor device having a back end of line, a power storage device, or the like.

The layer of the layer structure may be a single layer or a stacked layer of 2 or more layers.

(Contact Resistance Reducing Layer)

The contact resistance reducing layer serves to prevent interaction of the substrate as the base and the Schottky electrode metal, and to improve the adhesion of the Schottky electrode to the base surface smoothness of the Schottky electrode. That is, this layer serves to reduce contact resistance when the substrate and the Schottky electrode are directly laminated.

When the substrate and the Schottky electrode are directly laminated, for example, when a n-type low-resistance silicon substrate is used as the substrate and palladium oxide is used as the Schottky electrode, and they are directly laminated, palladium oxide and Si form reverse p-n junction, whereby a large resistance component in a forward direction is formed. In addition, the interface between Si and palladium oxide is not smooth, as a result, the surface smoothness of the Schottky electrode is lost, leading to lowering in dielectric voltage.

As the contact resistance reducing layer, one or more metals selected from Ti, Mo, Ag, In, Al, W, Co and Ni, alloys or silicides thereof can be used. Ti, Mo, Ag, In or Al that forms a low-resistance silicide is preferable. Low-resistance Ti or Mo that forms a favorable Schottky contact when combining with the Schottky metal is more preferable. Mo having a high thermal conductivity is further preferable. Since Mo has excellent heat dissipation properties and high thermal conductivity, degradation of a device hardly occurs due to Joule heat caused by current during diode driving.

The thickness of the contact resistance reducing layer is usually 1 nm to 1 μm, preferably 2 nm to 500 nm, more preferably 5 nm to 500 nm. Within this thickness range, the layer has sufficient adhesiveness and resistance increases only slightly. Further preferably, the thickness of the contact resistance reducing layer is 10 nm to 500 nm. By allowing the film thickness to be 10 nm or more, the in-plane coating property of the contact resistance reducing layer becomes high, whereby properties that the in-plane variations of forward resistance are small at the time of driving a diode can be obtained easily. Further, when used as a device in which current is laterally extracted, wiring resistance is lowered, whereby a high current value can be obtained easily.

The contact resistance reducing layer can be confirmed by a cross-sectional TEM observation or a secondary ion mass spectrometry. The same is applied to an ohmic electrode, a metal oxide semiconductor layer, a reduction suppressing layer, a Schottky electrode layer and a substrate.

(Reduction Suppressing Layer)

The reduction suppressing layer is a layer that prevents reduction of the Schottky electrode layer. By providing the reduction suppressing layer, reduction of the Schottky electrode layer is suppressed, whereby a Schottky interface can be formed without problems.

As the metal used in the reduction suppressing layer, one or more element selected from Pd, Mo, Pt, Ir, Ru, Au, Ni, W, Cr, Re, Te, Tc, Mn, Os, Fe, Rh and Co or an alloy thereof can be given.

As the reduction suppressing layer, it is preferable to use the same element as metal elements constituting a Schottky electrode layer mentioned later, i.e. to use the same metal as the metal oxide constituting the Schottky electrode layer. As the combination of the reduction suppressing layer and the Schottky electrode layer (reduction suppressing layer/Schottky electrode layer), Pd/palladium, Pt/platinum oxide, Ir/iridium oxide, Ru/ruthenium oxide or the like can be given.

The thickness of the reduction suppressing layer is normally 1 nm to 1 μm, preferably 2 nm to 500 nm, more preferably 5 nm to 100 nm, and particularly preferably 10 nm to 50 nm. Within this range, since it has excellent reduction suppressing effects, on-resistance at forward bias can be reduced. Further, the smoothness of the Schottky interface can be improved.

(Schottky Electrode Layer)

The work function of the metal contained in the Schottky electrode layer is preferably 3.7 eV or more, more preferably 4.4 eV or more, and further preferably 4.7 eV or more. The upper limit of the work function is not particularly restricted but is normally 6.5 eV. By using a metal oxide using the metal having a work function in this range in the Schottky electrode layer, an energy barrier is formed in the interface between the Schottky and the metal oxide semiconductor, whereby the leakage current can be maintained low as the characteristics of the device.

The work function is measured by photoelectron spectroscopy.

As the metal for the Schottky electrode layer, an oxide of one or more metals selected from Pd, Mo, Pt, Ir, Ru, Ni, W, Cr, Re, Te, Tc, Mn, Os, Fe, Rh and Co, or an oxide of an alloy of these metals. A Pd oxide, a Pt oxide, an Ir oxide or a Ru oxide is preferable. If these metal oxides are used, by combination with a metal oxide semiconductor, a high Schottky barrier can be formed.

It is preferred that the carrier concentration of the Schottky electrode layer be $1 \times 10^{18}$ cm$^{-3}$ or more. The carrier concentration can be obtained by a hall measurement, for example.

The thickness of the Schottky electrode layer is normally 1 nm to 1 μm, preferably 2 nm to 100 nm, and more preferably 5 nm to 50 nm. Within this range, it has an excellent on-resistance at forward bias. Further, the smoothness of the Schottky interface can be improved, whereby it has an excellent withstand voltage.

A production method for obtaining a metal oxide of the Schottky electrode is not particularly restricted. A method in which a reactive sputtering is conducted for a metal target in an oxygen-containing atmosphere or the like is given.

(Metal Oxide Semiconductor Layer)

No specific restrictions are imposed on the composition of the metal oxide semiconductor layer, as long as it is a metal oxide semiconductor. It is preferred that it be an oxide containing one or more elements selected from In, Ga, Zn and Sn. An oxide semiconductor of In, Ga and Zn (IGZO) can be given, for example.

Further, no restrictions are imposed on crystallinity. Any of a layer formed of an amorphous oxide semiconductor, a layer formed of a polycrystalline oxide semiconductor, a layer formed of a monocrystalline oxide semiconductor layer or a layer formed of a mixture thereof can be used.

The concentration of a hydrogen atom in the metal oxide semiconductor layer is preferably $10^{17}$ to $10^{22}/cm^3$, more preferably $10^{19}$ to $10^{22}/cm^3$, with $10^{20}$ to $10^{21}/cm^3$ being further preferable. An oxide semiconductor tends to form an oxygen deficiency easily, and current may leak through the deficiency. By increasing the concentration of hydrogen atoms in the film to $10^{20}/cm^3$ or more, it is possible to terminate the oxygen deficiency with a hydroxyl group, thus reducing leakage current. The concentration of hydrogen atoms is measured by secondary ion mass spectrometry. The method for adjusting the concentration of hydrogen atoms is not particularly restricted. However, it can be adjusted by optimizing the atmosphere at the time of film formation, the annealing after the film formation and the atmosphere at the time of forming an ohmic electrode.

The free carrier concentration of the metal oxide semiconductor layer is normally $1 \times 10^{13}$ cm$^{-3}$ or more and less than $1 \times 10^{18}$ cm$^{-3}$. The free carrier concentration can be measured by a hall measurement, for example.

The band gap of the metal oxide semiconductor layer is preferably 2.0 eV to 6.0 eV, more preferably 2.5 eV to 5.5 eV, and further preferably 3.0 eV to 5.0 eV. The band gap is measured by the method described in the Examples. By using the metal oxide semiconductor layer having a band gap in this range, it is possible to obtain a device having a low on-resistance.

The thickness of the metal oxide semiconductor layer is normally 10 nm to 10 μm, preferably 50 nm to 7 μm, and more preferably 100 nm to 5 μm. The film thickness can be selected such that a desired withstand voltage can be obtained. If the thickness is too large, the resistance at the time of applying forward bias may be increased.

The laminated body of the invention can provide a Schottky barrier diode that exhibits good diode properties even if it is produced by a method that has excellent productivity such as sputtering.

(Ohmic Electrode Layer)

The materials of the ohmic electrode layer are not particularly restricted as long as a favorable ohmic connection can be attained with a metal oxide semiconductor layer. As the materials, one or more elements selected from the group consisting of Mo, Ti, Au, Ag and Al, or an alloy thereof can be given.

The ohmic electrode layer can be formed of a plurality of layers. For example, a Mo electrode layer is used on the side that is in contact with the metal oxide semiconductor layer. Further, a layer of a metal such as Au and Al can be laminated thereon. Due to such a configuration, current can be extracted with reduced power loss.

The thickness of the ohmic electrode layer is not particularly restricted. Normally, it is 100 nm to 5 μm.

The film forming method is not particularly restricted. However, a CVD method such as a thermal CVD method, a CAT-CVD method, a photo-CVD method, a mist CVD method, an MO-CVD method and a plasma CVD method; a film-forming method with atomic level control such as MBE and ALD; a PVD method such as ion plating, ion beam sputtering and magnetron sputtering; a method in which a conventionally known ceramic process is used such as a doctor blading method, an injection method, an extrusion method, a heat pressing method, a sol-gel method, an aerosol deposition method or the like; and a wet method such as a coating method, a spin coating method, a printing method, a spray method, an electrodeposition method, a plating method and a micellar electrolysis method can be used.

[Semiconductor Device]

The laminated body of the invention can be used in a semiconductor device such as a power semiconductor device, a (rectifying) diode device, a Schottky barrier diode device, an electrostatic discharge (ESD) protection diode, a transient voltage suppressor (TVS) protection diode, a light emitting diode, a metal semiconductor field effect transistor (MESFET), a junction field effect transistor (JFET), a metal oxide semiconductor field effect transistor (MOSFET), a Schottky source/drain MOSFET, an avalanche multiplication type photoelectric conversion device, a solid state imaging device, a solar cell device, an optical sensor device, a display device, a resistance change memory or the like. In particular, since current can be extracted without causing power loss, the laminated body is suited to power semiconductors. The semiconductor device can be used for a Schottky barrier diode and a junction transistor. An electric circuit using this device, a Schottky barrier diode and a junction transistor can be used in an electric apparatus, an electronic apparatus, a vehicle, a power engine or the like.

EXAMPLES

Example 1

[Fabrication of Schottky Barrier Diode]

A Schottky barrier diode was fabricated as follows:

An n-type Si substrate (diameter: 4 inches) having a resistivity of 1 mΩcm was mounted on a sputtering apparatus (E-200S manufactured by Canon Anelva Corporation), and Ti was formed as a contact resistance reducing layer with a thickness of 15 nm. The film formation conditions were as follows: DC 50 W, Ar atmosphere. Subsequently, as a Schottky electrode layer, palladium oxide was formed into a 10 nm-thick film (carrier concentration: $1 \times 10^{20}$ cm$^{-3}$). Film forming conditions: DC 50 W and a mixed gas atmosphere of Ar and $O_2$. Subsequently, this substrate was mounted in a sputtering apparatus (CS-200, manufactured by ULVAC) together with an areamask, and IGZO having a metal composition (atomic ratio) shown in Table 1 was formed into a 200 nm-thick film as the metal oxide semiconductor layer. The film forming conditions were as follows: DC 300 W, gas flow rate shown in Table 1. Thereafter, this substrate was taken out, and subjected to annealing for 1 hour at 300° C. in air in an electric furnace. This substrate was mounted again in a sputtering apparatus together with an areamask, and Mo was formed into a 150 nm-film as the ohmic electrode layer. The film forming conditions were as follows: DC 100 W, Ar atmosphere

[Measurement of Free Carrier Concentration]

The free carrier concentration of the metal oxide semiconductor layer and the carrier concentration of the Schottky electrode layer were measured as follows:

On the glass substrate, the metal oxide layer forming step (or Schottky electrode forming step) was conducted. Then, the substrate was cut into 1 cm square pieces, and an In electrode was put on the four sides, whereby a device for measuring a hall effect was prepared. As for the measurement of the free carrier concentration (carrier concentration), a hall effect measurement was conducted at room temperature by using a hall effect measurement apparatus (HL-5500PC, manufactured by ACCENT), and the obtained amount of free carriers (carrier amount) was standardized by the volume of the metal semiconductor layer (or the volume of Schottky electrode), whereby the free carrier concentration (carrier concentration) was obtained.

[Evaluation of Band Gap]

The band gap of the metal oxide semiconductor layer was evaluated as follows: On the substrate, steps up to the metal oxide semiconductor layer forming step in the above-described Schottky barrier diode fabricating step were conducted, and the obtained laminated body was cut into 1 cm-square pieces. At room temperature, the incident angle of polarized light was changed to 50°, 60° and 70° from the direction vertical to the substrate using a spectroscopic ellipsometry measurement apparatus (M-2000D manufactured by JA Woollam Japan KK), and for each incident angle, measurement was carried out with measurement wavelengths of 192.3 nm to 1689 nm and measuring widths of 3.4 nm. For the resulting spectra y and A, for each layer, Drude model, Tauc-Lorentz model, Gaussian function model was put as the absorption model, optimization was conducted until the square error MSE became 10 or less, whereby an absorption coefficient $\alpha$ was calculated for the energy of each light. By using the spectrum of the absorption coefficient $\alpha$ of the metal oxide semiconductor layer, $\alpha^2$ was plotted against the light energy range (2 eV to 5 eV), and the straight line was extended and the intersection with the energy axis was calculated as a band gap. The results were shown in Table 1.

[Hydrogen Atom Concentration]

The concentration of hydrogen atom of the metal oxide semiconductor layer was evaluated as follows:

Measurement was conducted by using a quadrupole secondary mass spectrometer (D-SIMS manufactured by Ulvac-Phi. Inc.) under measurement conditions of Cs ion source 1 kV, a primary ion current 100 nA and the vacuum degree of chamber of $5 \times 10^{-10}$ torr. The hydrogen atom concentration of the metal oxide semiconductor layer was determined as follows. The intensity, which is obtained by integrating the secondary ion intensity at each depth H obtained by the quadrupole secondary ion mass spectrometer with the film thickness of the metal semiconductor thin film, was normalized using the intensity of In—Ga—Zn—O thin film of which the hydrogen concentration and the film thickness are known, and the quantification of the hydrogen concentration was performed, and the obtained value was taken as the hydrogen atom concentration. The results are shown in Table 1.

[Evaluation of Device]

For the obtained device (Si/Ti/palladium oxide/IGZO/Mo), on-resistance (Ron) and leakage current (Ir) were evaluated using B1500 manufactured by Agilent. The probe was connected to the ohmic electrode side and connected to the ground, and a measurement was conducting by changing the voltage on the substrate side. The on-resistance was a differential resistance (Ron=$\Delta V/\Delta I$) within ±0.2 V when 1V was applied to the device, and the leakage current was the current density when the applied voltage was −5V. The results are shown in Table 1.

The resulting device has a structure in which the reduction suppressing layer 30 was excluded in the structure shown in FIG. 6.

The device obtained in Example 1 had a low on-resistance of less than 1 m$\Omega$cm$^2$ and leakage current Ir was $9 \times 10^{-4}$ A/cm$^2$.

Example 2

Figure 8:
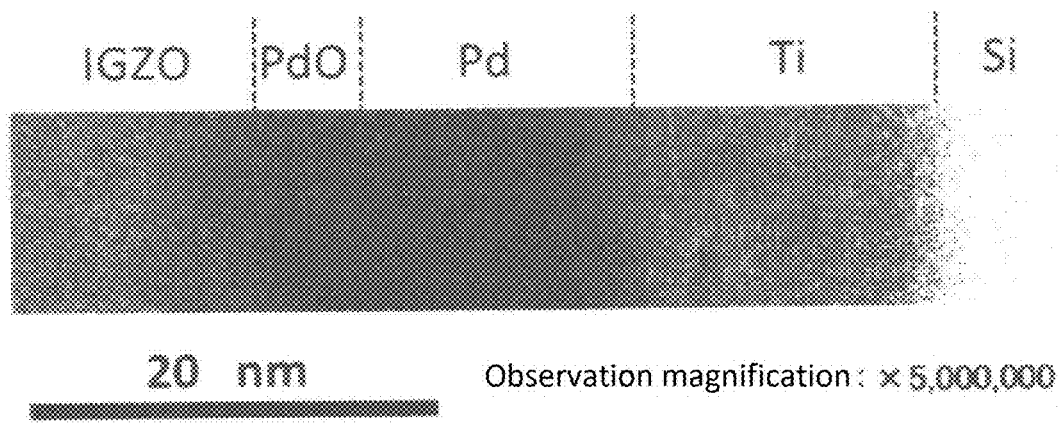
FIG. 8 is a cross-sectional TEM image of a laminated layer electrode fabricated in Example 2.

A device was fabricated in the same manner as in Example 1, except that Pd was formed into a 20 nm-thick film as the reduction suppressing layer. The film forming conditions were as follows: DC 50 W, Ar atmosphere. The TEM image of the cross section of the laminated electrode obtained by an electron microscope (JEM-2800 manufactured by JEOL) is shown in FIG. 8.

For the resulting device (Si/Ti/Pd/Palladium oxide/IGZO/Mo), an evaluation was conducted in the same manner as in Example 1. The results are shown in Table 1.

The obtained device has a structure shown in FIG. 6.

Example 3

A device was fabricated in the same manner as in Example 1, except that, subsequent to formation of the contact resistance reducing layer, Ru was formed into a 20 nm-thick film as a reduction suppressing layer, and then, ruthenium oxide was formed into a 10 nm-thick film as the Schottky electrode. The film forming conditions of Ru were as follows: DC 50 W, Ar atmosphere. The film forming conditions of ruthenium oxide were as follows: DC 50 W, mixed gas atmosphere of Ar and O$_2$ (carrier concentration: $1 \times 10^{20}$ cm$^{-3}$)

For the obtained device (Si/Ti/Ru/ruthenium oxide/IGZO/Mo), an evaluation was conducted in the same manner as in Example 1. The results are shown in Table 1.

The obtained device has a structure shown in FIG. 6.

Example 4

A device was fabricated in the same manner as in Example 1, except that, subsequent to formation of the contact resistance reducing layer, Pt was formed into a 20 nm-thick film as a reduction suppressing layer, and then, platinum oxide was formed into a 10 nm-thick film as the Schottky electrode. The film forming conditions of Pt were as follows: DC 50 W, Ar atmosphere. The film forming conditions of platinum oxide were as follows: DC 50 W, mixed gas atmosphere of Ar and O$_2$ (carrier concentration: $1 \times 10^{20}$ cm$^{-3}$)

For the resulting device (Si/Ti/Pt/Platinum oxide/IGZO/Mo), an evaluation was conducted in the same manner as in Example 1. The results are shown in Table 1.

The obtained device has a structure shown in FIG. 6.

Example 5

A device was fabricated in the same manner as in Example 1, except that, subsequent to formation of the contact resistance reducing layer, Ir was formed into a 20 nm-thick film as a reduction suppressing layer, and then, iridium oxide was formed into a 10 nm-thick film as the Schottky electrode. The film forming conditions of Ir were as follows: DC 50 W, Ar atmosphere. The film forming conditions of iridium oxide were as follows: DC 50 W, mixed gas atmosphere of Ar and $O_2$ (carrier concentration: $1 \times 10^{20}$ cm$^{-3}$).

For the resulting device (Si/Ti/Ir/iridium oxide/IGZO/Mo), the same evaluation was conducted as in Example 1. The results are shown in Table 1.

The obtained device has a structure shown in FIG. 6.

The devices obtained in Examples 2 to 5 had an on-resistance of less than 1 mΩcm$^2$ and had leakage current Ir of $3 \times 10^{-8}$ A/cm$^2$ or less, showing excellent diode characteristics.

Comparative Example 1

A device was fabricated in the same manner as in Example 1, except that no contact resistance reducing layer was formed. For the obtained device (Si/palladium oxide/IGZO/Mo), an evaluation was conducted in the same manner as in Example 1. The results are shown in Table 1. The device obtained in Comparative Example 1 has a significantly high on-resistance Ron of 200 mΩcm$^2$ or more and had leakage current Ir of $2 \times 10^{-3}$ A/cm$^2$.

Examples 6 to 9

Devices were fabricated in the same manner as in Example 2, except that the combination of the reduction suppressing layer and the Schottky electrode layer was changed to those shown in Table 2. For the obtained device, an evaluation was conducted in the same manner as in Example 1. The results are shown in Table 2.

The devices obtained in Examples 6 to 9 had an on-resistance Ron of less than 10 mΩcm$^2$, and had leakage current Ir of $5 \times 10^{-8}$ A/cm$^2$ or less, showing excellent diode characteristics.

Examples 10 to 12

Devices were fabricated in the same manner as in Example 2, except that the film thickness of the Schottky electrode layer was changed to those shown in Table 3. For the obtained device, an evaluation was conducted in the same manner as in Example 1. The results are shown in Table 3.

The devices obtained in Examples 10 and 11 had an on-resistance Ron of less than 1 mΩcm$^2$ and leakage current Ir of $1 \times 10^{-7}$ A/cm$^2$ or less, showing excellent diode characteristics. The device obtained in Example 12 had an on-resistance of less than 10 mΩcm$^2$ and had leakage current of $3 \times 10^{-5}$ A/cm$^2$ or less.

Examples 13 to 15

Devices were fabricated in the same manner as in Example 2, except that the Schottky electrode layer and the reduction suppressing layer were changed to those shown in Table 4. For the obtained device, an evaluation was conducted in the same manner as in Example 1. The results are shown in Table 4.

The device obtained in Example 13 had an on-resistance Ron of less than 1 mΩcm$^2$ and leakage current Ir of $5 \times 10^{-7}$ A/cm$^2$ or less, showing excellent diode characteristics. The devices obtained in Examples 14 and 15 had a low on-resistance Ron of less than 1 mΩcm$^2$ and had leakage current of $2 \times 10^{-3}$ A/cm$^2$ and $7 \times 10^{-1}$ A/cm$^2$, respectively.

Examples 16 to 19

Figure 9:
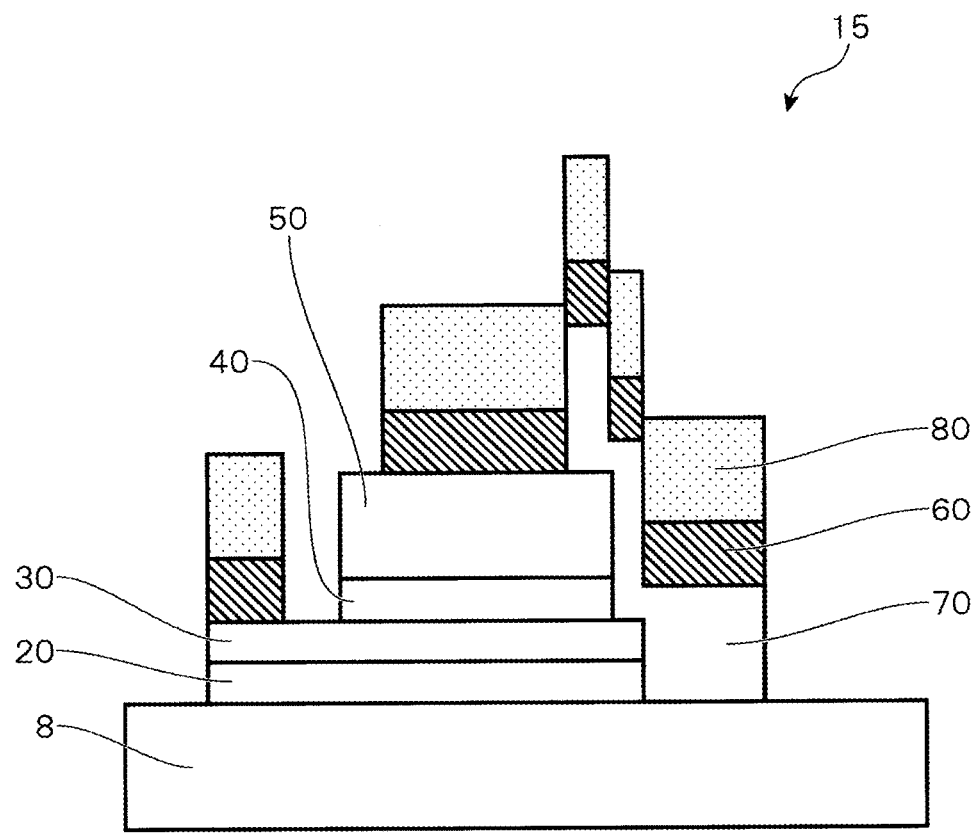
FIG. 9 is a cross-sectional view of the device fabricated in Examples 16 to 28.

On the substrate shown in Table 5, a device was fabricated by using a photomask. The film forming conditions of each layer were the same as those in Example 2. FIG. 9 shows the structure of the obtained device (laminated body) 15.

First, on one surface of the substrate 8, a 15 nm-thick Ti film was deposited by sputtering as the contact resistance reducing layer 20 and a 20 nm-thick Pd film was deposited by sputtering as the reduction suppressing layer 30, respectively. Subsequently, by using a photomask, a laminated body of Ti/Pd was patterned. As the photoresist, AZ1500 (manufactured by AZ Electronic Materials) was used, and after exposure through a photomask, development was conducted by tetramethyl ammonium hydroxide (TMAH) and Pd was subjected to a first patterning by using AURUM-302 (manufactured by Kanto Chemical Co., Ltd.) to allow Ti to be exposed. When Ti was exposed, Ti was subjected to a second patterning by using KSMF-200 (manufactured by Kanto Chemical Co., Ltd.), whereby a lower electrode was formed.

Subsequently, by using an image reversal resist AZ5214 (manufactured by AZ Electronic Materials) and a photomask, PdO as the Schottky electrode layer 40 and InGaZnO (In:Ga:Zn=33.3:33.3:33.3 at %) as the metal oxide semiconductor layer 50 were subjected to patterning by a lift-off process. Specifically, AZ5214 was exposed to light through a photomask, and after reversal baking, AZ5214 was exposed to light entirely, and developed by tetramethyl ammonium hydroxide (TMAH). On the patterned substrate with a photoresist, palladium oxide was formed into a 20 nm-thick film, and thereafter, InGaZnO (In:Ga:Zn=33.3:33.3:33.3 at %) was formed into a 200 nm-thick film. Thereafter, by lifting off in acetone, palladium oxide was subjected to patterning as the Schottky electrode layer 40 and InGaZnO (In:Ga:Zn=33.3:33.3:33.3 at %) was subjected patterning as the metal oxide semiconductor layer 50.

Subsequently, the interlayer insulating film 70 was subjected to patterning by using thermosetting non-photosensitive polyimide and a photomask.

Specifically, first, the thermosetting non-photosensitive polyimide solution was applied on one surface of the substrate by using a spin coater in a thickness of about 8 μm. Subsequently, patterning was conducted by AZ5214 and a photomask. AZ5214 was exposed to light through a photomask, and after the reversal baking step, AZ5214 was exposed to light entirely, and developed by tetramethyl ammonium hydroxide (TMAH). Subsequently, the thermosetting non-photosensitive polyimide was etched with TMAH, and subjected to patterning. After patterning, the thermosetting non-photosensitive polyimide was cured by heating in air at 200° C. for 1 hour.

Subsequently, by using an image reversal resist AZ5214 and a photomask, the ohmic electrode layer 60 was subjected to patterning by a lift-off process. AZ5214 was exposed to light through a photomask, and after the reversal baking, AZ5214 was exposed to light entirely, and developed by tetramethyl ammonium hydroxide (TMAH). On the patterned substrate with a photoresist, Mo was formed into a 150 nm-thick film as the ohmic electrode layer, and then, the Au layer 80 was formed into a 500 nm-thick film. Thereafter, by lifting off in acetone, the ohmic electrode layer 60 was patterned.

The probe was grounded to the ohmic electrode side and connected to the ground, and the probe was grounded to a region where the ohmic electrode and Au were directly laminated on the reduction suppressing layer, and measurement was conducting by changing the voltage on the substrate side. Other evaluations were conducted in the same manner as in Example 1. The results are shown in Table 5. The carrier concentration of the Schottky electrode layer was $1\times10^{20}$ cm$^{-3}$.

The devices obtained in Examples 16 to 18 had an on-resistance Ron of less than 1 mΩcm$^2$, had leakage current Ir of $5\times10^{-8}$ A/cm$^2$ or less, showing excellent diode characteristics. The device obtained in Example 19 had leakage current Ir of $1\times10^{-1}$ A/cm, which was higher than those in Examples 16 to 18.

[Measurement of the Surface Roughness of Substrate]

The surface roughness of the substrate was measured by observing the obtained device by a cross-sectional TEM (transmission electron microscope) image and EDX (energy-dispersive X-ray spectroscopy). The specific procedures are shown below. The area where each constituent element of each substrate shown in Table 5 was detected by EDX is defined as the substrate. Furthermore, in the cross-sectional TEM image, an interface was defined from the difference in contrast between the substrate and the ohmic electrode layer. An arithmetic mean roughness Ra was calculated by the formula (1) for the unevenness of the substrate interface with respect to a cross-sectional TEM image of an area of 10 μm in the direction perpendicular to the film thickness, and was defined as surface roughness. The results are shown in Table 5.

$$Ra = \frac{1}{l}\int_0^l |f(x)|dx \quad (1)$$

l: Film thickness and length of observation area in vertical direction (here, 10 μm)

f(x): Function showing unevenness of interface

[Measurement of Crystallinity of the Substrate]

The crystallinity of the substrate was evaluated by an electron beam diffraction image obtained by an electron microscope (JEM-2800 manufactured by JEOL). As for the irradiation area of the electron beam, a diffraction image was obtained from a region having a diameter of 10 nm or more with respect to the substrate cross section. In the diffraction image, one in which the spot shape was observed was determined as monocrystalline and the one observed in the ring shape was judged as polycrystalline. The results are shown in Table 5.

Examples 20 to 23

Devices were fabricated in the same manner as in Example 16, except that the insulating substrate shown in Table 6 was used. For the obtained device, an evaluation was conducted in the same manner as in Example 16. The results are shown in Table 6. The carrier concentration of the Schottky electrode layer was $1\times10^{20}$ cm$^{-3}$.

The devices obtained in Examples 20 to 23 had an on-resistance Ron of less than 1 mΩcm$^2$, leakage current Ir of $3\times10^{-7}$ A/cm$^2$ or less, showing excellent diode characteristics.

Examples 24 to 28

Devices were fabricated in the same manner as in Example 2, except that the metal oxide semiconductor layer was formed by the metal composition and the ratio of introducing gas at the time of film formation shown in Table 7. For the obtained devices, an evaluation was conducted in the same manner as in Example 1. The results are shown in Table 7.

The obtained device had a structure shown in FIG. 6.

The devices obtained in Examples 24 to 28 had an on-resistance Ron of less than 1 mΩcm$^2$, and had leakage current Ir of $2\times10^{-6}$ A/cm$^2$ or less, showing excellent diode characteristics.

Examples 29 to 33

Devices were fabricated in the same manner as in Example 2, except that the metal oxide semiconductor layer was formed by the metal composition and the ratio of introduced gas at the time of film formation shown in Table 8. For the obtained devices, an evaluation was conducted in the same manner as in Example 1. The results are shown in Table 8.

As a result of evaluating the hydrogen atom concentration for the devices obtained in Examples 29 to 31, the hydrogen atom concentrations were $8\times10^{20}$ cm$^{-3}$, $5\times10^{21}$ cm$^{-3}$ and $5\times10^{20}$ cm$^{-3}$ respectively. The devices obtained in Examples 29 to 31 had an on-resistance Ron of less than 1 mΩcm$^2$, and leakage current Ir of $2\times10^{-8}$ A/cm$^2$ or less, showing excellent diode characteristics.

As a result of evaluating the hydrogen atom concentration for the devices obtained in Examples 32 and 33, the hydrogen atom concentrations were $4\times10^{15}$ Cm$^{-3}$ and $8\times10^{16}$ cm$^{-3}$, respectively. The devices obtained in Examples 32 and 33 had an on-resistance Ron of less than 1 mΩcm$^2$, and leakage current Ir of $9\times10^{-1}$ A/cm$^2$ and $1\times10^{-2}$ A/cm$^2$, respectively.

Examples 34 to 35

Devices were fabricated in the same manner as in Example 2, except that the contact resistance reducing layer or the ohmic electrode layer were formed of the materials shown in Table 9. For the obtained devices, an evaluation was conducted in the same manner as in Example 1. The results are shown in Table 9.

The devices obtained in Examples 34 and 35 had an on-resistance Ron of less than 1 mΩcm$^2$, and had leakage current Ir of $1\times10^{-1}$ A/cm$^2$ and $3\times10^{-8}$ A/cm$^2$, respectively, showing excellent diode characteristics.

TABLE 1

| | | | Example 1 | Example 2 | Example 3 |
|---|---|---|---|---|---|
| Device configuration | Substrate back electrode | Material | Ti | Ti | Ti |
| | | Film thickness (nm) | 150 | 150 | 150 |
| | Substrate | Material | Monocrystal n-Si | Monocrystal n-Si | Monocrystal n-Si |
| | | Electric resistivity (mΩcm) | 1 | 1 | 1 |
| | | Thickness (μm) | 250 | 250 | 250 |

TABLE 1-continued

|  |  |  | | | |
|---|---|---|---|---|---|
|  | Contact resistance reducing layer | Composition | Ti | Ti | Ti |
|  |  | Film thickness (nm) | 15 | 15 | 15 |
|  | Reduction suppressing layer | Composition | None | Pd | Ru |
|  |  | Film thickness (nm) |  | 20 | 20 |
|  | Schottky electrode layer | Composition | Palladium oxide | Palladium oxide | Ruthenium oxide |
|  |  | Work function of contained metal element (eV) | 5.1 | 5.1 | 4.7 |
|  |  | Film thickness (nm) | 20 | 20 | 20 |
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % |
|  |  | Ratio of introduced gas at the time of film formation | Ar:H2O = 99:1 | Ar:H2O = 99:1 | Ar:H2O = 99:1 |
|  |  | Film thickness (nm) | 200 | 200 | 200 |
|  |  | Band gap (eV) | 3.75 | 3.75 | 3.75 |
|  |  | Hydrogen atom concentration ($cm^{-3}$) | $4 \times 10^{20}$ | $4 \times 10^{20}$ | $4 \times 10^{20}$ |
|  | Ohmic electrode layer | Composition | Mo | Mo | Mo |
|  |  | Film thickness (nm) | 150 | 150 | 150 |
| Evaluation |  | Forward properties: on-resistance ($mΩcm^2$) | <1 | <1 | <1 |
|  |  | Reverse properties: leakage current ($A/cm^2$) | $9 \times 10^{-4}$ | $2 \times 10^{-9}$ | $3 \times 10^{-8}$ |

|  |  |  | Example 4 | Example 5 | Comp. Ex. 1 |
|---|---|---|---|---|---|
| Device configuration | Substrate back electrode | Material | Ti | Ti | Ti |
|  |  | Film thickness (nm) | 150 | 150 | 150 |
|  | Substrate | Material | Monocrystal n-Si | Monocrystal n-Si | Monocrystal n-Si |
|  |  | Electric resistivity (mΩcm) | 1 | 1 | 3 |
|  |  | Thickness (μm) | 250 | 250 | 250 |
|  | Contact resistance reducing layer | Composition | Ti | Ti | None |
|  |  | Film thickness (nm) | 15 | 15 |  |
|  | Reduction suppressing layer | Composition | Pt | Ir | None |
|  |  | Film thickness (nm) | 20 | 20 |  |
|  | Schottky electrode layer | Composition | Platinum oxide | Iridium oxide | Palladium oxide |
|  |  | Work function of contained metal element (eV) | 5.6 | 5.3 | 5.1 |
|  |  | Film thickness (nm) | 20 | 20 | 20 |
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % |
|  |  | Ratio of introduced gas at the time of film formation | Ar:H2O = 99:1 | Ar:H2O = 99:1 | Ar:H2O = 99:1 |
|  |  | Film thickness (nm) | 200 | 200 | 200 |
|  |  | Band gap (eV) | 3.75 | 3.75 | 3.75 |
|  |  | Hydrogen atom concentration ($cm^{-3}$) | $4 \times 10^{20}$ | $4 \times 10^{20}$ | $4 \times 10^{20}$ |
|  | Ohmic electrode layer | Composition | Mo | Mo | Mo |
|  |  | Film thickness (nm) | 150 | 150 | 150 |
| Evaluation |  | Forward properties: on-resistance ($mΩcm^2$) | <1 | <1 | >200 |
|  |  | Reverse properties: leakage current ($A/cm^2$) | $1 \times 10^{-8}$ | $3 \times 10^{-8}$ | $2 \times 10^{-3}$ |

TABLE 2

|  |  |  | Example 6 | Example 7 | Example 8 | Example 9 |
|---|---|---|---|---|---|---|
| Device configuration | Substrate Back electrode | Material | Ti | Ti | Ti | Ti |
|  |  | Film thickness (nm) | 150 | 150 | 150 | 150 |
|  | Substrate | Material | Monocrystal n-Si | Monocrystal n-Si | Monocrystal n-Si | Monocrystal n-Si |
|  |  | Electric resistivity (mΩcm) | 1 | 1 | 1 | 1 |
|  |  | Thickness (μm) | 250 | 250 | 250 | 250 |
|  | Contact resistance reducing layer | Composition | Ti | Ti | Ti | Ti |
|  |  | Film thickness (nm) | 15 | 15 | 15 | 15 |
|  | Reduction suppressing layer | Composition | Ru | Pt | Ir | Pd |
|  |  | Film thickness (nm) | 20 | 20 | 20 | 20 |
|  | Schottky electrode layer | Composition | Palladium oxide | Ruthenium oxide | Platinum oxide | Iridium oxide |
|  |  | Work function of contained metal element (eV) | 5.1 | 4.7 | 5.6 | 5.3 |
|  |  | Film thickness (nm) | 20 | 20 | 20 | 20 |

TABLE 2-continued

|  |  |  | Example 6 | Example 7 | Example 8 | Example 9 |
|---|---|---|---|---|---|---|
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  |  | Ratio of gas introduced at the time of film formation | Ar:H2O = 99:1 | Ar:H2O = 99:1 | Ar:H2O = 99:1 | Ar:H2O = 99:1 |
|  |  | Film thickness (nm) | 200 | 200 | 200 | 200 |
|  |  | Band gap (eV) | 3.75 | 3.75 | 3.75 | 3.75 |
|  |  | Hydrogen atom concentratiaon ($cm^{-3}$) | $4 \times 10^{20}$ | $4 \times 10^{20}$ | $4 \times 10^{20}$ | $4 \times 10^{20}$ |
|  | Ohmic electrode layer | Composition | Mo | Mo | Mo | Mo |
|  |  | Film thickness (nm) | 150 | 150 | 150 | 150 |
| Evaluation | Forward properties: on-resistance ($m\Omega cm^2$) |  | 2 | 5 | 9 | 8 |
|  | Reverse properties: leakage current ($A/cm^2$) |  | $6 \times 10^{-9}$ | $7 \times 10^{-8}$ | $5 \times 10^{-8}$ | $1 \times 10^{-9}$ |

TABLE 3

|  |  |  | Example 10 | Example 11 | Example 12 |
|---|---|---|---|---|---|
| Device configuration | Substrate back electrode | Material | Ti | Ti | Ti |
|  |  | Film thickness (nm) | 150 | 150 | 150 |
|  | Substrate | Material | Monocrystal n-Si | Monocrystal n-Si | Monocrystal n-Si |
|  |  | Electric resistivity (m Ω cm) | 1 | 1 | 1 |
|  |  | Thickness (μm) | 250 | 250 | 250 |
|  | Contact resistance reducing layer | Composition | Ti | Ti | Ti |
|  |  | Film thickness (nm) | 15 | 15 | 15 |
|  | Reduction suppressing layer | Composition | Pd | Pd | Pd |
|  |  | Film thickness (nm) | 20 | 20 | 20 |
|  | Schottky eletrode layer | Composition | Palladium oxide | Palladium oxide | Palladium oxide |
|  |  | Work function of contained metal (eV) | 5.1 | 5.1 | 5.1 |
|  |  | Film thickness (nm) | 5 | 50 | 100 |
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % |
|  |  | Ratio of introduced gas at the time of film formation | Ar:H2O = 99:1 | Ar:H2O = 99:1 | Ar:H2O = 99:1 |
|  |  | Film thickness (nm) | 200 | 200 | 200 |
|  |  | Band gap (eV) | 3.75 | 3.75 | 3.75 |
|  |  | Hydrogen atom concentration ($cm^{-3}$) | $4 \times 10^{20}$ | $4 \times 10^{20}$ | $4 \times 10^{20}$ |
|  | Ohmic electrode layer | Composition | Mo | Mo | Mo |
|  |  | Film thickness (nm) | 150 | 150 | 150 |
| Evaluation | Forward properties: on-resistance ($m\Omega cm^2$) |  | <1 | <1 | 3 |
|  | Reverse properties: leakage current ($A/cm^2$) |  | $1 \times 10^{-7}$ | $5 \times 10^{-8}$ | $3 \times 10^{-5}$ |

TABLE 4

|  |  |  | Example 13 | Example 14 | Example 15 |
|---|---|---|---|---|---|
| Device configuration | Substrate back electrode | Material | Ti | Ti | Ti |
|  |  | Film thickness (nm) | 150 | 150 | 150 |
|  | Substrate | Material | Monocrystal n-Si | Monocrystal n-Si | Monocrystal n-Si |
|  |  | Electric resistivity (m Ω cm) | 1 | 1 | 1 |
|  |  | Thickness (μm) | 250 | 250 | 250 |
|  | Contact resistance reducing layer | Composition | Ti | Ti | Ti |
|  |  | Film thickness (nm) | 15 | 15 | 15 |
|  | Reduction suppressing layer | Composition | V | Zr | Mg |
|  |  | Film thickness (nm) | 20 | 20 | 20 |
|  | Schottky electrode layer | Composition | Vanadium oxide | Zirconium oxide | Magnesium oxide |
|  |  | Work function of contained metal (eV) | 4.4 | 4.1 | 3.7 |
|  |  | Film thickness (nm) | 20 | 20 | 20 |
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % |
|  |  | Ratio of introduced gas at the time of film formation | Ar:H2O = 99:1 | Ar:H2O = 99:1 | Ar:H2O = 99:1 |

TABLE 4-continued

|  |  |  | Example 13 | Example 14 | Example 15 |
|---|---|---|---|---|---|
|  |  | Film thickness (nm) | 200 | 200 | 200 |
|  |  | Band gap (eV) | 3.75 | 3.75 | 3.75 |
|  |  | Hydrogen atom concentration (cm$^{-3}$) | $4 \times 10^{20}$ | $4 \times 10^{20}$ | $4 \times 10^{20}$ |
|  | Ohmic electrode layer | Composition | Mo | Mo | Mo |
|  |  | Film thickness (nm) | 150 | 150 | 150 |
| Evaluation | Forward properties: on-resistance (mΩcm$^2$) |  | <1 | <1 | <1 |
|  | Reverse properties: leakage current (A/cm$^2$) |  | $5 \times 10^{-7}$ | $2 \times 10^{-3}$ | $7 \times 10^{-1}$ |

TABLE 5

|  |  |  | Example 16 | Example 17 | Example 18 | Example 19 |
|---|---|---|---|---|---|---|
| Device configuration | Substrate | Material | ZnO | ZnO | SiC | ZnO |
|  |  | Surface roughness Ra[nm] | 10 | 2 | 3 | 39 |
|  |  | Crystallinity | Polycrystalline | Monocrystalline | Monocrystalline | Monocrystalline |
|  |  | Thickness (μm) | 250 | 250 | 250 | 250 |
|  | Contact resistance reducing layer | Composition | Ti | Ti | Ti | Ti |
|  |  | Film thickness (nm) | 15 | 15 | 15 | 15 |
|  | Reduction suppressing layer | Composition | Pd | Pd | Pd | Pd |
|  |  | Film thickness (nm) | 20 | 20 | 20 | 20 |
|  | Schottky electrode layer | Composition | Palladium oxide | Palladium oxide | Palladium oxide | Palladium oxide |
|  |  | Work function of contained metal (eV) | 5.1 | 5.1 | 5.1 | 5.1 |
|  |  | Film thickness (nm) | 20 | 20 | 20 | 20 |
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % | In:Ga:Zn = 33.3:33.3:33.3 at % |
|  |  | Ratio of introduced gas at the time of film formation | Ar:H2O = 99:1 | Ar:H2O = 99:1 | Ar:H2O = 99:1 | Ar:H2O = 99:1 |
|  |  | Film thickness (nm) | 200 | 200 | 200 | 200 |
|  |  | Band gap (eV) | 3.75 | 3.75 | 3.75 | 3.75 |
|  |  | Hydrogen atom concentration (cm$^{-3}$) | $4 \times 10^{20}$ | $4 \times 10^{20}$ | $4 \times 10^{20}$ | $4 \times 10^{20}$ |
|  | Ohmic electrode layer | Composition | Mo | Mo | Mo | Mo |
|  |  | Film thickness (nm) | 150 | 150 | 150 | 150 |
| Evaluation | Forward properties: on-resistance (mΩcm$^2$) |  | <1 | <1 | <1 | <1 |
|  | Reverse properties: leakage current (A/cm$^2$) |  | $5 \times 10^{-8}$ | $3 \times 10^{-9}$ | $5 \times 10^{-9}$ | $1 \times 10^{-1}$ |

TABLE 6

|  |  |  | Example 20 | Example 21 | Example 22 | Example 23 |
|---|---|---|---|---|---|---|
| Device configuration | Substrate | Material | Quartz glass | Sapphire substrate | Polyimide substrate | Lithium niobate substrate |
|  |  | Surface roughness Ra [nm] | 1 | 4 | 3 | 15 |
|  |  | Crystallinity | Polycrystallline | Monocrystalline | Monocrystalline | Monocrystalline |
|  |  | Thickness (μm) | 250 | 250 | 250 | 300 |
|  | Contact resistance reducing layer | Composition | Ti | Ti | Ti | Ti |
|  |  | Film thickness (nm) | 15 | 15 | 15 | 15 |
|  | Reduction suppressing layer | Composition | Pd | Pd | Pd | Pd |
|  |  | Film thickness (nm) | 20 | 20 | 20 | 20 |
|  | Schottky electrode layer | Composition | Palladium oxide | Palladium oxide | Palladium oxide | Palladium oxide |
|  |  | Work function of contained metal element (eV) | 5.1 | 5.1 | 5.1 | 5.1 |
|  |  | Film thickness (nm) | 20 | 20 | 20 | 20 |
|  | Metal oxide semiconductor layer | Metal composition | In:Ga:Zn = 33.3:33.3:33.3 at % | In:Ga:Zn = 33.3:33.3:33.3 at % | In:Ga:Zn = 33.3:33.3:33.3 at % | In:Ga:Zn= 33.3:33.3:33.3 at % |
|  |  | Ratio of introduced gas at the time of film formation | Ar:H2O = 99:1 | Ar:H2O = 99:1 | Ar:H2O = 99:1 | Ar:H2O = 99:1 |
|  |  | Film thickness (nm) | 200 | 200 | 200 | 200 |
|  |  | Band gap (eV) | 3.75 | 3.75 | 3.75 | 3.75 |
|  |  | Hydrogen atom concentration (cm$^{-3}$) | $4 \times 10^{20}$ | $4 \times 10^{20}$ | $4 \times 10^{20}$ | $4 \times 10^{20}$ |

TABLE 6-continued

|  |  |  | Example 20 | Example 21 | Example 22 | Example 23 |
|---|---|---|---|---|---|---|
|  | Ohmic electrode layer | Composition | Mo | Mo | Mo | Mo |
|  |  | Film thickness (nm) | 150 | 150 | 150 | 150 |
| Evaluation |  | Forward properties: on-resistance (mΩcm$^2$) | <1 | <1 | <1 | <1 |
|  |  | Reverse properties: leakage current (A/cm$^2$) | $3 \times 10^{-7}$ | $1 \times 10^{-9}$ | $4 \times 10^{-8}$ | $5 \times 10^{-8}$ |

TABLE 7

|  |  |  | Example 24 | Example 25 | Example 26 |
|---|---|---|---|---|---|
| Device configuration | Substrate back electrode | Material | Ti | Ti | Ti |
|  |  | Film thickness (nm) | 150 | 150 | 150 |
|  | Substrate | Material | Monocrystal n-Si | Monocrystal n-Si | Monocrystal n-Si |
|  |  | Electric resistivity (mΩcm) | 1 | 1 | 1 |
|  |  | Thickness (μm) | 250 | 250 | 250 |
|  | Contact resistance reducing layer | Composition | Ti | Ti | Ti |
|  |  | Film thickness (nm) | 15 | 15 | 15 |
|  | Reduction suppressing layer | Composition | Pd | Pd | Pd |
|  |  | Film thickness (nm) | 20 | 20 | 20 |
|  | Schottky electrode layer | Composition | Palladium oxide | Palladium oxide | Palladium oxide |
|  |  | Work function of contained metal element (eV) | 5.1 | 5.1 | 5.1 |
|  |  | Film thickness (nm) | 20 | 20 | 20 |
|  | Metal oxide semiconductor layer | Metal composition | In:Sn:Zn = 36.5:15:48.5 at % | In:Sn:Zn = 36.5:15:48.5 at % | In = 100% |
|  |  | Ratio of introduced gas at the time of film formation | Ar:H2O = 99.5:0.5 | Ar:H2O = 90:10 | Ar:H2O = 98:2 |
|  |  | Film thickness (nm) | 200 | 200 | 200 |
|  |  | Band gap (eV) | 3.45 | 3.54 | 3.16 |
|  |  | Hydrogen atom concentration (cm$^{-3}$) | $4 \times 10^{20}$ | $8 \times 10^{20}$ | $1 \times 10^{21}$ |
|  | Ohmic electrode layer | Composition | Mo | Mo | Mo |
|  |  | Film thickness (nm) | 150 | 150 | 150 |
| Evaluation |  | Forward properties: on-resistance (mΩcm$^2$) | <1 | <1 | <1 |
|  |  | Reverse properties: leakage current (A/cm$^2$) | $4 \times 10^{-8}$ | $2 \times 10^{-8}$ | $2 \times 10^{-6}$ |

|  |  |  | Example 27 | Example 28 |
|---|---|---|---|---|
| Device configuration | Substrate back electrode | Material | Ti | Ti |
|  |  | Film thickness (nm) | 150 | 150 |
|  | Substrate | Material | Monocrystal n-Si | Monocrystal n-Si |
|  |  | Electric resistivity (mΩcm) | 1 | 1 |
|  |  | Thickness (μm) | 250 | 250 |
|  | Contact resistance reducing layer | Composition | Ti | Ti |
|  |  | Film thickness (nm) | 15 | 15 |
|  | Reduction suppressing layer | Composition | Pd | Pd |
|  |  | Film thickness (nm) | 20 | 20 |
|  | Schottky electrode layer | Composition | Palladium oxide | Palladium oxide |
|  |  | Work function of contained metal element (eV) | 5.1 | 5.1 |
|  |  | Film thickness (nm) | 20 | 20 |
|  | Metal oxide semiconductor layer | Metal composition | In:Ga = 50:50 at % | In:Ga:Zn = 50:10:40 at % |
|  |  | Ratio of introduced gas at the time of film formation | Ar:H2O = 98:2 | Ar:H2O = 98:2 |
|  |  | Film thickness (nm) | 200 | 200 |
|  |  | Band gap (eV) | 4.01 | 3.40 |
|  |  | Hydrogen atom concentration (cm$^{-3}$) | $6 \times 10^{20}$ | $8 \times 10^{20}$ |
|  | Ohmic electrode layer | Composition | Mo | Mo |
|  |  | Film thickness (nm) | 150 | 150 |
| Evaluation |  | Forward properties: on-resistance (mΩcm$^2$) | <1 | <1 |
|  |  | Reverse properties: leakage current (A/cm$^2$) | $4 \times 10^{-10}$ | $2 \times 10^{-8}$ |

TABLE 8

|  |  |  | Example 29 | Example 30 | Example 31 |
|---|---|---|---|---|---|
| Device configuration | Substrate back electrode | Material | Ti | Ti | Ti |
|  |  | Film thickness (nm) | 150 | 150 | 150 |
|  | Substrate | Material | Monocrystal n-Si | Monocrystal n-Si | Monocrystal n-Si |
|  |  | Electric resistivity (mΩcm) | 1 | 1 | 1 |
|  |  | Thickness (μm) | 250 | 250 | 250 |
|  | Contact resistance reducing layer | Composition | Ti | Ti | Ti |
|  |  | Film thickness (nm) | 15 | 15 | 15 |
|  | Reduction suppressing layer | Composition | Pd | Pd | Pd |
|  |  | Film thickness (nm) | 20 | 20 | 20 |
|  | Schottky electrode layer | Composition | Palladium oxide | Palladium oxide | Palladium oxide |
|  |  | Work function of contained metal element (eV) | 5.1 | 5.1 | 5.1 |
|  |  | Film thickness (nm) | 20 | 20 | 20 |
|  | Metal oxide semiconductor layer | Metal composition | In:Ga:Zn = 33.3:33.3:33.3 at % | In:Ga:Zn = 33.3:33.3:33.3 at % | In:Sn:Zn = 36.5:15:48.5 at % |
|  |  | Ratio of introduced gas at the time of film formation | Ar:H2O = 98:2 | Ar:H2O = 90:10 | Ar:H2O = 98.5:1.5 |
|  |  | Film thickness (nm) | 200 | 200 | 200 |
|  |  | Band gap (eV) | 3.78 | 3.83 | 3.52 |
|  |  | Hydrogen atom concentration (cm$^{-3}$) | $8 \times 10^{20}$ | $5 \times 10^{21}$ | $5 \times 10^{20}$ |
|  | Ohmic electrode layer | Composition | Mo | Mo | Mo |
|  |  | Film thickness (nm) | 150 | 150 | 150 |
| Evaluation |  | Forward properties: on-resistance (mΩcm$^2$) | <1 | <1 | <1 |
|  |  | Reverse properties: leakage current (A/cm$^2$) | $1 \times 10^{-9}$ | $5 \times 10^{-10}$ | $2 \times 10^{-8}$ |

|  |  |  | Example 32 | Example 33 |
|---|---|---|---|---|
| Device configuration | Substrate back electrode | Material | Ti | Ti |
|  |  | Film thickness (nm) | 150 | 150 |
|  | Substrate | Material | Monocrystal n-Si | Monocrystal n-Si |
|  |  | Electric resistivity (mΩcm) | 1 | 1 |
|  |  | Thickness (μm) | 250 | 250 |
|  | Contact resistance reducing layer | Composition | Ti | Ti |
|  |  | Film thickness (nm) | 15 | 15 |
|  | Reduction suppressing layer | Composition | Pd | Pd |
|  |  | Film thickness (nm) | 20 | 20 |
|  | Schottky electrode layer | Composition | Palladium oxide | Palladium oxide |
|  |  | Work function of contained metal element (eV) | 5.1 | 5.1 |
|  |  | Film thickness (nm) | 20 | 20 |
|  | Metal oxide semiconductor layer | Metal composition | In:Ga:Zn = 33.3:33.3:33.3 at % | In:Ga:Zn = 33.3:33.3:33.3 at % |
|  |  | Ratio of introduced gas at the time of film formation | Ar:O2 = 90:10 | Ar:O2 = 80:20 |
|  |  | Film thickness (nm) | 200 | 200 |
|  |  | Band gap (eV) | 3.70 | 3.70 |
|  |  | Hydrogen atom concentration (cm$^{-3}$) | $4 \times 10^{15}$ | $8 \times 10^{16}$ |
|  | Ohmic electrode layer | Composition | Mo | Mo |
|  |  | Film thickness (nm) | 150 | 150 |
| Evaluation |  | Forward properties: on-resistance (mΩcm$^2$) | <1 | <1 |
|  |  | Reverse properties: leakage current (A/cm$^2$) | $9 \times 10^{-1}$ | $1 \times 10^{-2}$ |

TABLE 9

|  |  |  | Example 34 | Example 35 |
|---|---|---|---|---|
| Device configuration | Substrate back electrode | Material | Ti | Ti |
|  |  | Film thickness (nm) | 150 | 150 |
|  | Substrate | Material | Monocrystal n-Si | Monocrystal n-Si |
|  |  | Electric resistivity (mΩcm) | 1 | 1 |
|  |  | Thickness (μm) | 250 | 250 |
|  | Contact resistance reducing layer | Composition | Mo | Ti |
|  |  | Film thickness (nm) | 15 | 15 |

TABLE 9-continued

|  |  | Example 34 | Example 35 |
|---|---|---|---|
|  | Reduction suppressing layer Composition | Pd | Pd |
|  | Film thickness (nm) | 20 | 20 |
|  | Schottky electrode layer Composition | Palladium oxide | Palladium oxide |
|  | Work function of contained metal element (eV) | 5.1 | 5.1 |
|  | Film thickness (nm) | 20 | 20 |
|  | Metal oxide semiconductor layer Metal composition | In:Ga:Zn = 33.3:33.3:33.3 at % | In:Ga:Zn = 33.3:33.3:33.3 at % |
|  | Ratio of introduced gas at the time of film formation | Ar:H2O = 99:1 | Ar:H2O = 99:1 |
|  | Film thickness (nm) | 200 | 200 |
|  | Band gap (eV) | 3.75 | 3.75 |
|  | Hydrogen atom concentration (cm$^{-3}$) | $4 \times 10^{20}$ | $4 \times 10^{20}$ |
|  | Ohmic electrode layer Composition | Mo | Ti |
|  | Film thickness (nm) | 150 | 150 |
| Evaluation | Forward properties: on-resistance (mΩcm$^2$) | <1 | <1 |
|  | Reverse properties: leakage current (A/cm$^2$) | $1 \times 10^{-9}$ | $3 \times 10^{-8}$ |

From the results shown in Tables 1 to 9, it is understood that the semiconductor device utilizing the laminated body of the invention has a significantly small forward on-resistance. Further, reverse leakage current is sufficiently small.

INDUSTRIAL APPLICABILITY

The laminated body of the invention can be used in a semiconductor device such as a power semiconductor device, a diode device, a Schottky barrier diode device or the like, and an electric circuit using this device can be used in an electric apparatus, an electronic apparatus, an electric vehicle or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The specification of the Japanese patent applications claiming the priority under the Paris Convention to the invention is incorporated herein by reference in its entirety.

The invention claimed is:

1. A laminated body comprising:
a substrate,
a reduction suppressing layer,
a Schottky electrode layer, and
a metal oxide semiconductor layer in this order,
wherein the Schottky electrode layer comprises an oxide of one or more metals selected from Pd, Mo, Pt, Ir, Ru, Ni, W, Cr, Re, Te, Tc, Mn, Os, Fe, Rh, and Co, and
wherein the reduction suppressing layer comprises one or more elements selected from Pd, Mo, Pt, Ir, Ru, Au, W, Cr, Re, Te, Tc, Mn, Os, Fe, Rh and Co.

2. The laminated body according to claim 1, further comprising a contact resistance reducing layer positioned between the substrate and the reduction suppressing layer.

3. The laminated body according to claim 2, wherein the contact resistance reducing layer comprises one or more metals selected from Ti, Mo, Ag, In, Al, W, Co and Ni, or silicides thereof.

4. The laminated body according to claim 1, wherein the Schottky electrode layer comprises an oxide of one or more elements having a work function of 4.4 eV or more.

5. The laminated body according to claim 1, wherein the Schottky electrode layer comprises a Pd oxide, a Pt oxide, an Ir oxide, or a Ru oxide.

6. The laminated body according to claim 1, wherein the substrate is a conductive substrate.

7. The laminated body according to claim 1, wherein the substrate is a conductive silicon substrate.

8. The laminated body according to claim 1, wherein the metal oxide semiconductor layer comprises one or more elements selected from In, Sn, Ga and Zn.

9. The laminated body according to claim 1, wherein the metal oxide semiconductor layer has a hydrogen atom concentration of $10^{17}$ to $10^{22}$/cm$^3$.

10. The laminated body according to claim 1, further comprising an ohmic electrode layer on the metal oxide semiconductor layer.

11. The laminated body according to claim 1, wherein an outer edge of the metal oxide semiconductor layer is positioned on the same position as the position of an outer edge of the Schottky electrode layer or is positioned on the inside of an outer edge of the Schottky electrode layer, and the Schottky electrode layer is in contact with an entire lower surface of the metal oxide semiconductor layer.

12. The laminated body according to claim 10, wherein the outer edge of the ohmic electrode layer is positioned on the same position as the position of the outer edge of the metal oxide semiconductor layer or is positioned on the inside of the outer edge of the metal oxide semiconductor layer.

13. A semiconductor device wherein the laminated body according to claim 1 is used.

14. A Schottky barrier diode wherein the semiconductor device according to claim 13 is used.

15. A junction transistor wherein the semiconductor device according to claim 13 is used.

16. An electronic circuit wherein the semiconductor device according to claim 13 is used.

17. An electric apparatus, an electronic apparatus, a vehicle or power engine wherein the electronic circuit according to claim 16 is used.

18. An electronic circuit wherein the Schottky barrier diode according to claim 14 is used.

19. An electric apparatus, an electronic apparatus, a vehicle or power engine wherein the electronic circuit according to claim 18 is used.

20. An electronic circuit wherein the junction transistor according to claim 15 is used.

21. An electric apparatus, an electronic apparatus, a vehicle or power engine wherein the electronic circuit according to claim 20 is used.

22. The laminated body according to claim 1, wherein the same metal is used for the reduction suppressing layer as the metal oxide constituting the Schottky electrode layer.

* * * * *